(12) United States Patent
Yiu et al.

(10) Patent No.: US 8,791,768 B2
(45) Date of Patent: Jul. 29, 2014

(54) CAPACITIVE COUPLER PACKAGING STRUCTURE

(76) Inventors: Ho-Yin Yiu, Kln (HK); Chien-Hung Liu, New Taipei (TW); Ying-Nan Wen, Hsinchu (TW); Shih-Yi Lee, Zhongli (TW); Wei-Chung Yang, Pingzhen (TW); Bai-Yao Lou, Hsinchu (TW); Hung-Jen Lee, Taipei (TW)

( * ) Notice: Subject to any disclaimer, the term of this patent is extended or adjusted under 35 U.S.C. 154(b) by 279 days.

(21) Appl. No.: 13/359,460

(22) Filed: Jan. 26, 2012

(65) Prior Publication Data

US 2012/0194301 A1 Aug. 2, 2012

Related U.S. Application Data

(60) Provisional application No. 61/437,490, filed on Jan. 28, 2011.

(51) Int. Cl.
*H01P 5/08* (2006.01)
*H05K 1/18* (2006.01)

(52) U.S. Cl.
USPC .......................................... 333/24 C; 361/760

(58) Field of Classification Search
USPC .......... 333/24 C; 257/758, 780; 361/760, 763
See application file for complete search history.

(56) References Cited

U.S. PATENT DOCUMENTS

| | | | |
|---|---|---|---|
| 6,975,517 B1 * | 12/2005 | Kwong et al. | 361/763 |
| 7,262,974 B2 * | 8/2007 | Yang et al. | 361/780 |
| 7,301,751 B2 | 11/2007 | Lee et al. | |
| 7,535,105 B2 * | 5/2009 | Voldman | 257/758 |
| 8,198,951 B2 * | 6/2012 | Dong et al. | 333/12 |
| 8,441,325 B2 * | 5/2013 | Callahan et al. | 333/24 R |

FOREIGN PATENT DOCUMENTS

| | | |
|---|---|---|
| CN | 101351924 | 1/2009 |
| TW | 201021173 | 6/2010 |
| TW | 201145490 | 12/2011 |

* cited by examiner

*Primary Examiner* — Dean O Takaoka
(74) *Attorney, Agent, or Firm* — Liu & Liu

(57) ABSTRACT

Embodiments of the present invention provide a capacitive coupler packaging structure including a substrate with at least one capacitor and a receiver formed thereon, wherein the at least one capacitor at least includes a first electrode layer, a second electrode layer and a capacitor dielectric layer therebetween, and the first electrode layer is electrically connected to the receiver via a solder ball. The capacitive coupler packaging structure also includes a transmitter electrically connecting to the capacitor.

20 Claims, 5 Drawing Sheets

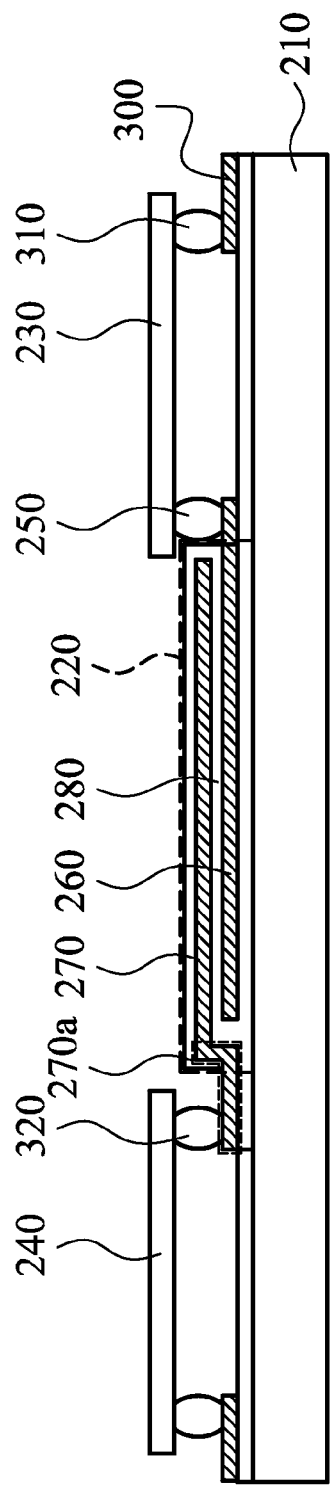
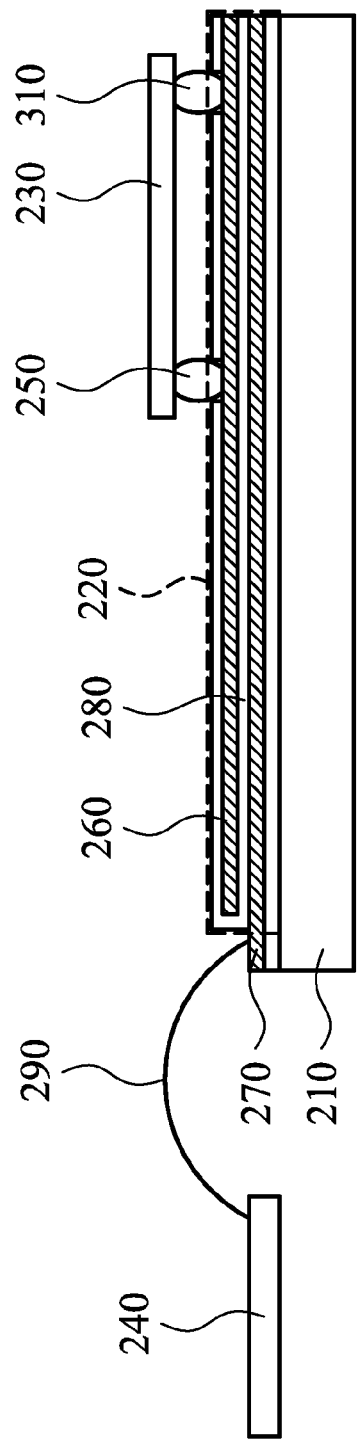

CAPACITIVE COUPLER PACKAGING STRUCTURE

CROSS REFERENCE TO RELATED APPLICATIONS

This application claims the benefit of U.S. Provisional Application No. 61/437,490 filed on Jan. 28, 2011, entitled "CAPACITIVE COUPLER PACKAGE STRUCTURE," which application is hereby incorporated herein by reference.

BACKGROUND OF THE INVENTION

1. Field of the Invention

The present invention relates to a packaging technique, and in particular, relates to a packaging technique of a capacitive coupler structure.

2. Description of the Related Art

A capacitive coupler is often used for isolation. The capacitive coupler can perform signal exchanges without current passing therethrough, and noise and damage resulting from ground potential difference can thus be avoided.

A conventional capacitive coupler has a poor performance due to a high RC delay because both of a receiver and a transmitter are electrically connected to the capacitor via wire bonding.

A system on chip (SOC) capacitive coupler may provide a fast data transforming rate, low power consumption and high electromagnetic susceptibility. In the SOC capacitive coupler, the capacitor and the receiver are disposed on a same substrate for reducing a resistance between the capacitor and the receiver. Referring to FIG. 1, a capacitor 120 is directly disposed on a receiver chip 130, and the capacitor 120 is electrically connected to a transmitter chip 140 via wire bonding 190.

However, in order to have a high breakdown voltage (e.g., >5 kV), the SOC capacitive coupler needs to use a thick capacitor dielectric layer, for example, about 1.2 μm. Therefore, a problem of wafer warpage may arise. US Pub. 2008/0277761 discloses an SOC capacitive coupler comprising a capacitor using stacked layers formed of multiple dielectric materials for reducing the thickness of the capacitor insulating layer. However, it may increase production cost of the SOC capacitive coupler.

Thus, development of a capacitive coupler which has a low RC delay and low production cost is needed.

BRIEF SUMMARY OF THE INVENTION

According to an illustrative embodiment of the invention, a capacitive coupler packaging structure comprises: a substrate having at least one capacitor and a receiver formed thereon, wherein the at least one capacitor at least comprises a first electrode layer, a second electrode layer and a capacitor dielectric layer interposed therebetween, and the first electrode layer is electrically connected to the receiver via a first solder ball; and a transmitter electrically connected to the second electrode layer.

According to another illustrative embodiment of the invention, a capacitive coupler packaging structure comprises: a substrate having an upper surface and a lower surface; at least one capacitor formed on the upper surface of the substrate, wherein the at least one capacitor at least comprises a first electrode layer, a second electrode layer and a capacitor dielectric layer interposed therebetween; a receiver formed on the lower surface of the substrate; and a transmitter formed on the lower surface of the substrate and separated with the receiver.

A detailed description is given in the following embodiments with reference to the accompanying drawings.

BRIEF DESCRIPTION OF THE DRAWINGS

The present invention can be further understood by reading the subsequent detailed description and examples with references made to the accompanying drawings, wherein:

FIGS. 4 to 7 show cross views of capacitive coupler packaging structures according to various embodiments of the present invention.

DETAILED DESCRIPTION OF THE INVENTION

Figure 1:
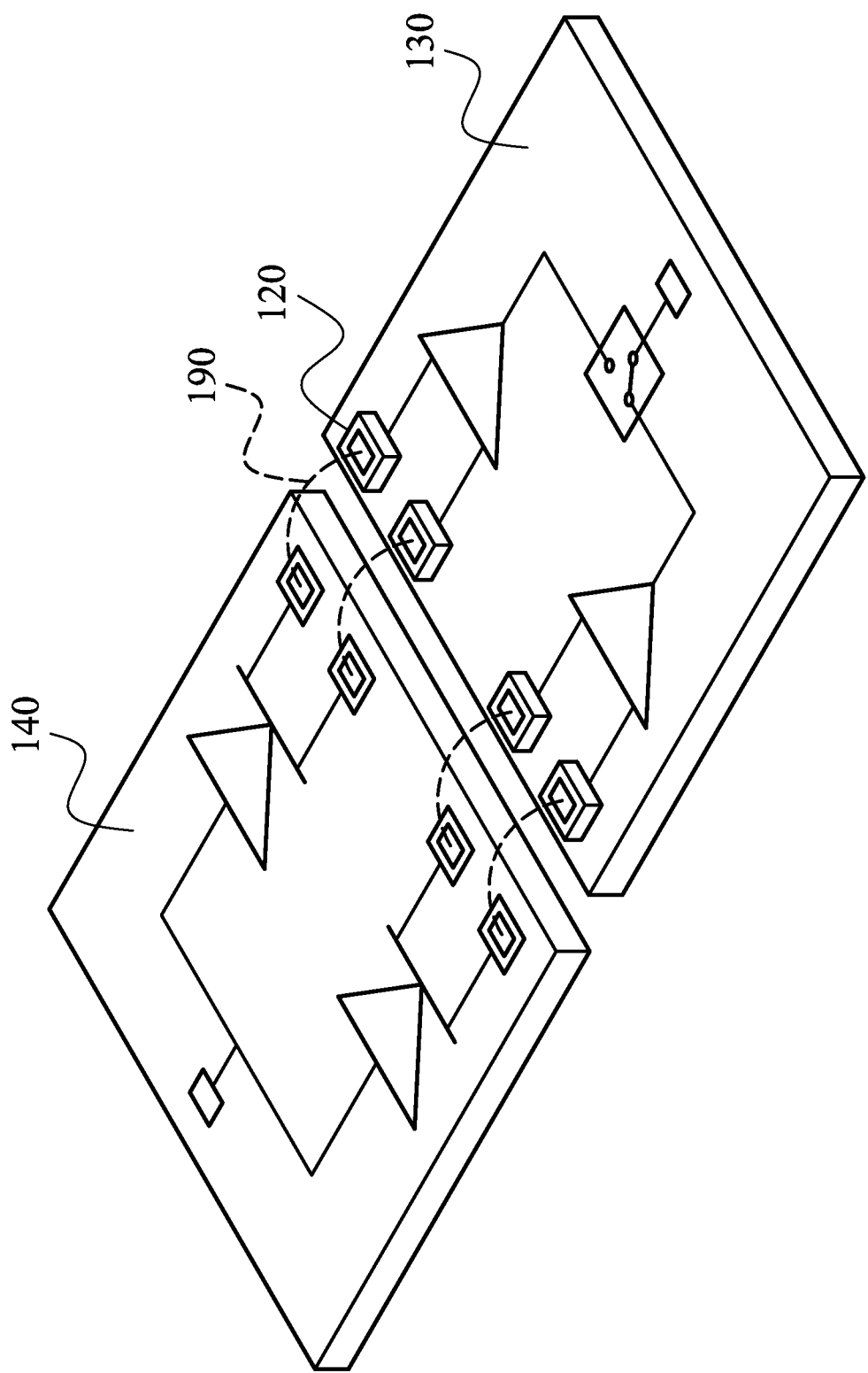
FIG. 1 shows a top view of a conventional capacitive coupler packaging structure.

The present invention will be illustrated in detail with references made to the accompanying drawings. In the drawings or the description, similar or same reference numbers are used to designate similar or same elements. In addition, sizes or shapes of elements shown in the drawings may be expanded for clarity or simplicity. Further, each element shown in the drawings will be illustrated. It should be understood that any element not shown or described may be any kind of conventional element as known by those skilled in the art. In addition, a specific embodiment is merely an example disclosing a specific use of the invention, which is not used to limit the present invention.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure. In addition, the present disclosure may repeat reference numerals and/or letters in the various examples. This repetition is for the purpose of simplicity and clarity and does not in itself dictate a relationship between the various embodiments and/or configurations discussed. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Figure 2:
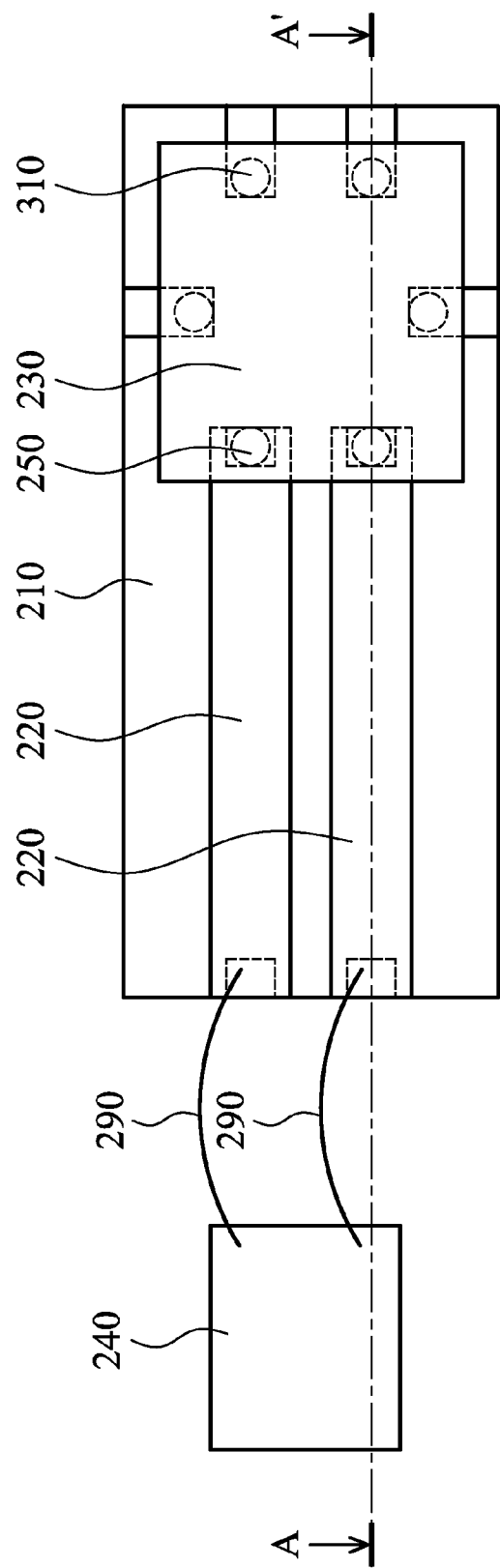
FIGS. 2 and 3 show a top view and a cross view of a capacitive coupler packaging structure according to an embodiment of the present invention, respectively.
Figure 3:
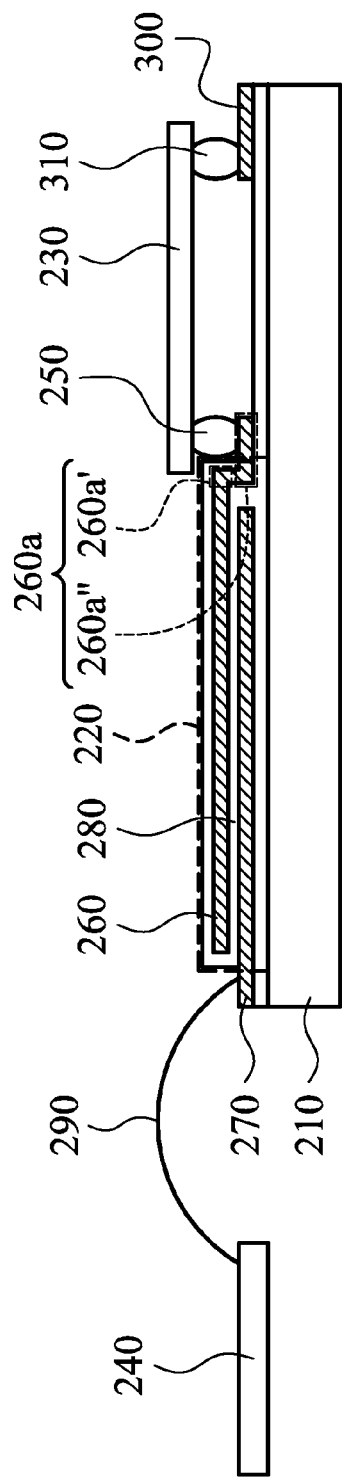
Figure 8:
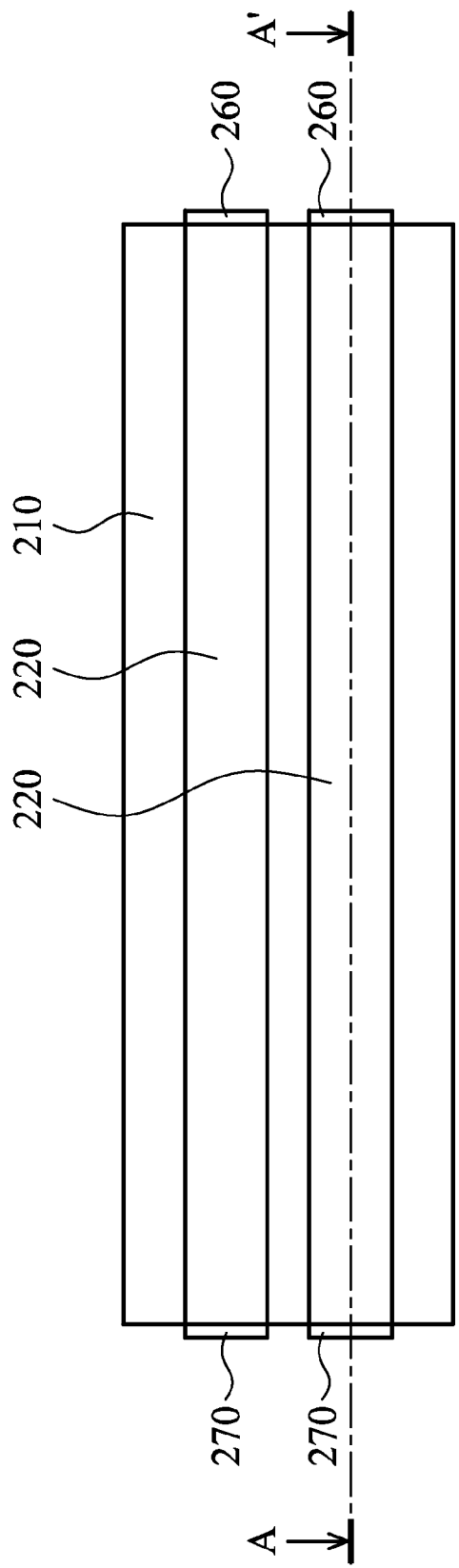
FIGS. 8 and 9 show a top view and a cross view of a capacitive coupler packaging structure according to another embodiment of the present invention, respectively.
Figure 9:
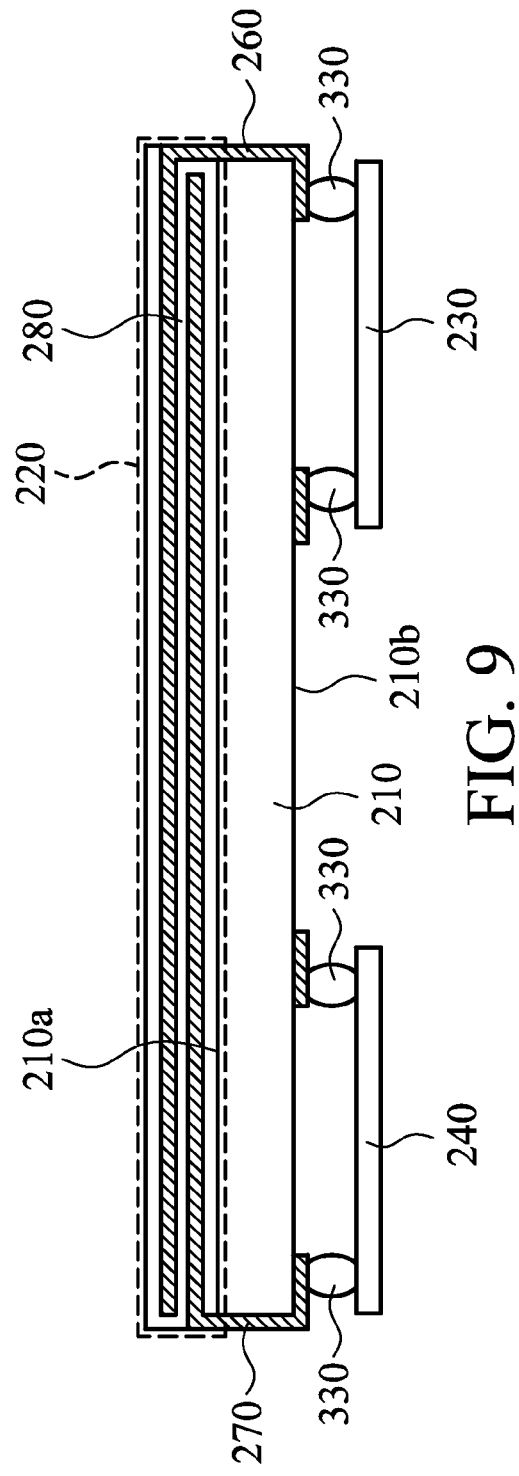

The present invention relates to a capacitive coupler packaging structure. FIGS. 2 and 3 show a top view and a cross view of a capacitive coupler packaging structure according to an embodiment of the present invention, respectively. FIGS. 4 to 7 show cross views of capacitive coupler packaging structures according to various embodiments of the present invention. FIGS. 8 and 9 show a top view and a cross view of a capacitive coupler packaging structure according to another embodiment of the present invention, respectively.

Referring to FIG. 2, a top view of a capacitive coupler packaging structure is illustrated. In this embodiment, the capacitive coupler packaging structure is formed by an insulating substrate 210, a pair of capacitors 220, a receiver 230 and a transmitter 240. The pair of capacitors 220 is formed on an insulating substrate 210. One end of the pair of capacitors 220 is directly electrically connected to a receiver 230 via solder balls 250 and the other end of the pair of capacitors 220 is electrically connected to a transmitter 240 via wire bonding 290. The capacitive coupler packaging structure may have a horizontal length (i.e., the distance between the outer side of the transmitter 240 and the outer side of the receiver 230, wherein the outer side means the far side relative to the pair of capacitors) of not less than about 9 mm for avoiding formation of air discharge.

FIG. 3 shows a cross view of the capacitive coupler packaging structure along the section A-A' shown in FIG. 2. In FIG. 3, the capacitive coupler packaging structure comprises the insulating substrate 210, the pair of capacitors 220, the receiver 230 and the transmitter 240, wherein the insulating substrate 210 may be formed of, for example, glass.

The pair of capacitors 220 and the transmitter 230 are formed on the insulating substrate 210. The pair of capacitors 220 comprises a first electrode layer 260 and a second electrode 270 which are interposed between a plurality of dielectric layers, wherein the plurality of dielectric layers comprises a capacitor dielectric layer interposed between and electrically isolating the first electrode layer 260 and the second electrode 270. In an embodiment, the first electrode layer 260 and the second electrode 270 may comprise any conducting materials, such as copper, aluminum, silver and/or alloys thereof. The capacitor insulating layer 280 may be formed of materials such as epoxy or other suitable insulators, for example, inorganic materials such as a silicon oxide layer, a silicon nitride layer, a silicon oxynitride layer, metal oxide or combinations thereof and organic polymers such as polyimide, butylcyclobutene (BCB, The Dow Chemical Company), parylene, polynaphthalenes, fluorocarbons, acrylates, etc. The capacitor insulating layer 280 may have a thickness of between 5 and 30 μm. It should be noted that a plurality of bonding pads is formed on the receiver 230 and the transmitter 240, but are not shown for simplicity.

In this embodiment, the first electrode layer 260 is an upper electrode layer 260, and the second electrode layer 270 is a lower electrode layer. Note that, in this description, the lower electrode layer means an electrode layer relatively near to the insulating substrate 210 and the upper electrode layer means an electrode layer relatively far away from the insulating substrate 210. In this embodiment, the first electrode layer 260 includes a side extension portion 260a extending over one end of the second electrode layer 270. A portion of the receiver 230 is disposed on the side extension portion 260a. As shown in FIG. 2, the side extension portion 260a of the first electrode layer 260 comprises a vertical extension portion 260a' and a horizontal extension portion 260a". The horizontal extension portion 260a" may be used as a bonding pad for connecting the pair of capacitors 220 and the receiver 230. A solder ball 250 is disposed on the horizontal extension portion 260a" such that the first electrode layer 260 is directly electrically connected to the receiver 230 via the solder ball 250.

The second electrode layer 270 also includes a horizontal portion extending over one end of the first electrode layer 260. The horizontal portion of the second electrode layer 270 may be used as a bonding pad for connection to the transmitter. In this embodiment, the second electrode layer 270 and the transmitter 240 are connected to each other via wire bonding 290. Since the pair of capacitors 220 and the receiver 230 are directly electrically connected via the solder ball 290, the RC delay between the receiver 230 and the transmitter 240 is reduced and therefore the total performance of the capacitive coupler packaging structure is enhanced.

An output pad 300 is also formed on the insulating substrate 210 for providing signals to the receiver 230. The output pad 300 is electrically connected to the receiver 230 via a solder ball 310. In an embodiment, the solder balls 250, and 310 may have a thickness of between about 250 and 300 μm. The solder ball may comprise solder-free materials, such as SnAg, SnAgCu and intermetallic compounds thereof.

Figure 4:
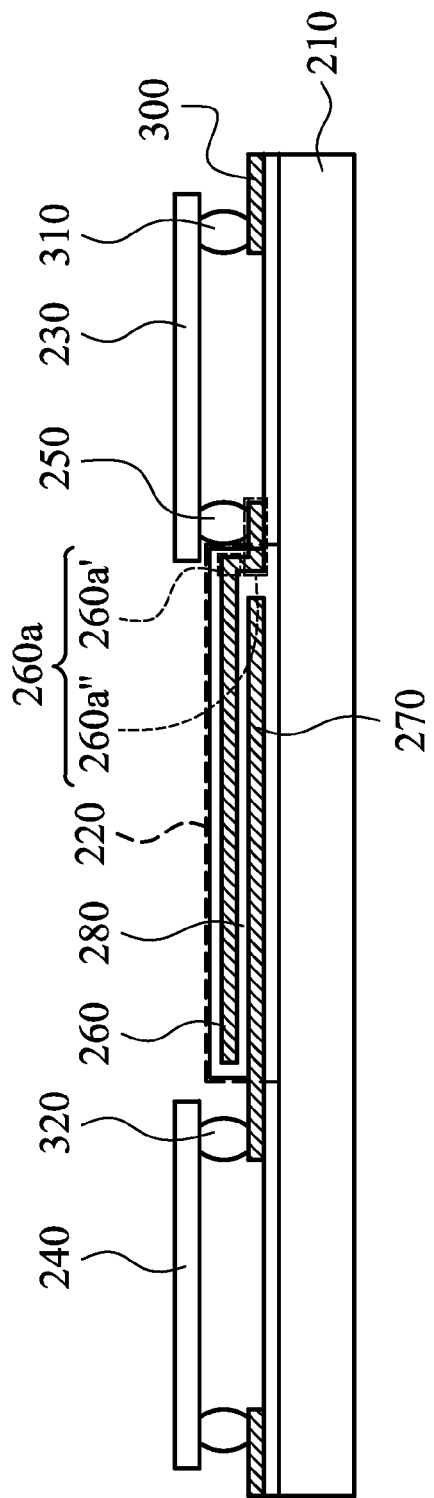

FIG. 4 shows a cross view of a capacitive coupler packaging structure according to another embodiment of the present invention. This embodiment is essentially the same with the embodiment shown in FIG. 3 except that each of the pair of capacitors 220, the receiver 230 and the transmitter 240 is formed on the same insulating substrate 210 and a portion of the transmitter 240 is formed on the second electrode layer 270 of the pair of capacitors 220 such that the transmitter 240 is directly electrically connected to the pair of capacitors 220 for reducing RC delay. In this embodiment, the capacitive coupler packaging structure may have a horizontal length (i.e., the distance between the outer side of the transmitter 240 and the outer side of the receiver 230, wherein the outer side means the far side relative to the pair of capacitors) of not less than about 9 mm, to avoid the formation of air discharge. Since the pair of capacitors 220 is directly electrically connected to the receiver 230 and the transmitters 240 via the solder balls 250 and 320, the use of wire bonding is completely avoided. Thus, the RC delay of the capacitive coupler packaging structure is significantly reduced.

Figure 5:
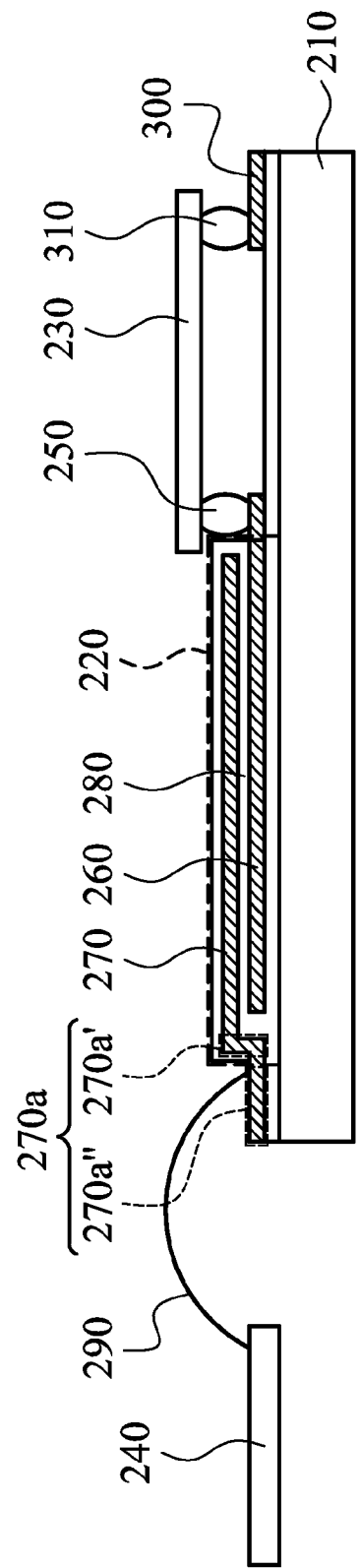

FIG. 5 shows a cross view of a capacitive coupler packaging structure according to yet another embodiment of the present invention. This embodiment is essentially the same with the embodiment shown in FIG. 3 except that the disposition of the upper electrode and lower electrode is opposite to the embodiment shown in FIG. 3. For example, in this embodiment, the first electrode layer 260 is the lower electrode layer, and the second electrode layer 270 is the upper electrode layer. Furthermore, the second electrode layer 270 has a side extension portion 270a. A portion of the transmitter 240 is formed on the side extension portion 270a. As shown in FIG. 5, the side extension portion 270a of the second electrode layer 270 includes a vertical extension portion 270a' and a horizontal extension portion 270a". The horizontal extension portion 270a" may be used as a bonding pad for connecting to the transmitter 240. For example, electrically connects to the transmitter 240 via wire bonding 290. The first electrode layer 260 also includes a horizontal portion extending over the second electrode layer 270 and the capacitor insulating layer 280. The horizontal portion of the first electrode layer 260 may be used for a bonding pad for electrically connecting the first electrode layer 260 and the receiver 230. The solder ball 250 is formed on and directly contacts to the first electrode layer 260 such that the first electrode layer 260 of the pair of capacitors 220 is electrically connected to the receiver 230 via the solder ball 250.

FIG. 6 shows a cross view of a capacitive coupler packaging structure according to still another embodiment of the present invention. This embodiment is essentially the same with the embodiment shown in FIG. 5 except that each of the pair of capacitors 220, the receiver 230 and the transmitter 240 is formed on the same insulating substrate 210. In this embodiment, the capacitive coupler packaging structure may have a horizontal length (i.e., the distance between the outer side of the transmitter 240 and the outer side of the receiver 230, wherein the outer side means the far side relative to the pair of capacitors) of not less than about 9 mm, to avoid the formation of air discharge. In this embodiment, a portion of the transmitter 240 is disposed on the second electrode layer 270 of the pair of capacitors 220 such that the transmitter 240 is directly electrically connected to the pair of capacitors 220 via a solder ball 320. Since the pair of capacitors is directly connected to the receiver 230 and the transmitter 240 via the solder balls 250 and 320, the use of wire bonding is completely avoided. Thus, the RC delay of the capacitive coupler packaging structure is significantly reduced.

FIG. 7 shows a cross view of a capacitive coupler packaging structure according to an alternative embodiment of the present invention. In this embodiment, the receiver 230 is directly disposed on the pair of capacitors 220. For example, the pair of capacitors 220 may be formed on the first electrode layer 260 and be electrically connected to the first electrode layer 260 via a solder ball 250. In other words, the first electrode layer 260 may be used as a bonding pad for connection to the receiver 230. The second electrode layer 270 has a portion extending over one end of the first electrode layer 260 and the capacitor insulating layer 280 as a bonding pad for connecting to the transmitter 240. In an embodiment, the second electrode layer 270 is electrically connected to the transmitter 240 via wire bonding 290. In another embodiment, the transmitter 240 and the pair of capacitors may be formed on the same insulating substrate 210 such that the second electrode layer 270 is capable of being connected to the transmitter 240 via a solder ball (not shown).

FIG. 8 shows a top view of a capacitive coupler packaging structure according to another alternative embodiment of the present invention. The electrode layers 260 and 270 have extension portions extending from the ends of the pair of capacitors 220 to the lower surface of the insulating substrate 210, respectively. In other words, only the pair of capacitors 220 may be formed on the upper surface of the insulating substrate 210, and each of the receiver 230 and the transmitter 240 may be formed on the lower surface of the insulating substrate 210 according to the design requirements.

FIG. 9 shows a cross view of the capacitive coupler packaging structure along the section A-A' shown in FIG. 8. In FIG. 9, the capacitive coupler packaging structure comprises an insulating substrate 210, a pair of capacitors 220, a receiver 230 and a transmitter 240, wherein the insulating substrate 210 may be formed of, for example, glass. The insulating substrate 210 has an upper surface 210a and a lower surface 210b. The pair of capacitors 220 is disposed on the upper surface 210a of the insulating substrate 210, and the receiver 230 and the transmitter 240 are separately formed on the lower surface 210b of the insulating substrate 210. The distance between the outer side of the transmitter 240 and the outer side of the receiver 230 is not less than about 9 mm for avoiding formation of air discharge.

The pair of capacitors 220 comprises a first electrode layer 260, a second electrode layer 270 and a capacitor dielectric layer 280 interposed between and electrically isolating the first electrode layer 260 and the second electrode layer 270. In this embodiment, the pair of capacitors 220 may be formed of similar or same materials as those of the pair of capacitors illustrated in FIG. 1.

In an embodiment, as shown in FIG. 9, the first electrode layer 260 and the second electrode layer 270 are extended from the two sidewalls of the insulating substrate 210 to the receiver 230 and the transmitter 240, respectively. For example, the first electrode layer 260 extends along one sidewall of the insulating substrate 210 onto the lower surface of the insulating substrate 210, and a solder ball 330 is formed on the extension portion of the first electrode layer 260 such that the receiver 230 is electrically connected to the first electrode layer 260 of the pair of capacitors 220 via the solder ball 330. Similarly, the second electrode layer 270 extends along the other sidewall of the insulating substrate 210 onto the lower surface of the insulating substrate 210, and a solder ball 330 is formed on the extension portion of the second electrode layer 270 such that the transmitter 240 is electrically connected to the second electrode layer 270 of the pair of capacitors 220 via the solder ball 330. In an embodiment, the capacitor may have a horizontal length substantially equal to that of the insulating substrate. For example, the capacitor may have a horizontal length of between about 9 and 15 mm. In another embodiment, the capacitor may have a horizontal length less than that of the insulating layer. For example, the capacitor may have a horizontal length of between about 5 and 11 mm. It should be noted that the position of the upper electrode layer and the lower electrode layer may be exchanged as long as the upper electrode layer and the lower electrode layer are electrically connected to the receiver 230 and the transmitter 240, respectively. The solder ball may comprise solder-free materials, such as SnAg, SnAgCu and intermetallic compounds thereof.

Embodiments of the present invention provide many kinds of capacitive coupler packaging structures. The capacitors are directly electrically connected to the receiver via the solder balls such that the RC delay resulting from wire bonding can be significantly reduced. The capacitors may optionally use wire bonding or solder balls to electrically connect to a transmitter. The receiver and the transmitter may be optionally formed on the upper surface or the lower surface of the insulating substrate. Thus, much circuit design flexibility is provided. In addition, in the capacitive coupler packaging structure according to the present invention, only common capacitors need to be used. Compared with the conventional SOC capacitive coupler, the capacitors don't need a thick capacitor dielectric layer or a capacitor dielectric layer formed of special materials. Also, the problems of wafer warpage and high production cost can be addressed.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A capacitive coupler packaging structure, comprising:
a substrate having at least one capacitor and a receiver formed thereon, wherein the at least one capacitor at least comprises a first electrode layer, a second electrode layer and a capacitor dielectric layer interposed therebetween, and the first electrode layer is electrically connected to the receiver via a first solder ball; and
a transmitter electrically connected to the second electrode layer.

2. The capacitive coupler packaging structure as claimed in claim 1, wherein the first electrode layer is an upper electrode layer and the second electrode layer is a lower electrode layer.

3. The capacitive coupler packaging structure as claimed in claim 2, wherein the first electrode layer further comprises a side extension portion, and a portion of the receiver is disposed on the side extension portion.

4. The capacitive coupler packaging structure as claimed in claim 3, wherein the side extension portion comprises a vertical extension portion and a horizontal extension portion, and the portion of the receiver is disposed on the horizontal extension portion.

5. The capacitive coupler packaging structure as claimed in claim 1, wherein the first electrode layer is a lower electrode layer and the second electrode layer is an upper electrode layer.

6. The capacitive coupler packaging structure as claimed in claim 5, wherein the second electrode layer further comprises a side extension portion, and a portion of the transmitter is disposed on the side extension portion.

7. The capacitive coupler packaging structure as claimed in claim 1, wherein the second electrode layer is electrically connected to the transmitter via a second solder ball.

8. The capacitive coupler packaging structure as claimed in claim 7, wherein the transmitter is formed on the substrate.

9. The capacitive coupler packaging structure as claimed in claim 1, wherein the second electrode layer is electrically connected to the transmitter via wire bonding.

10. The capacitive coupler packaging structure as claimed in claim 1, wherein the receiver is disposed on the capacitor.

11. The capacitive coupler packaging structure as claimed in claim 1, wherein the at least one capacitor dielectric layer has a thickness of between about 5 and 30 μm.

12. The capacitive coupler packaging structure as claimed in claim 1, further comprises a bonding pad formed on the substrate, and the bonding pad is electrically connected to the receiver via a third solder ball.

13. The capacitive coupler packaging structure as claimed in claim 1, wherein the outer side of the receiver and the outer side of the transmitter has a distance greater than about 9 mm.

14. The capacitive coupler packaging structure as claimed in claim 1, wherein the substrate is an insulating substrate.

15. A capacitive coupler packaging structure, comprising:
a substrate having an upper surface and a lower surface;
at least one capacitor formed on the upper surface of the substrate, wherein the at least one capacitor at least comprises a first electrode layer, a second electrode layer and a capacitor dielectric layer interposed therebetween;
a receiver formed on the lower surface of the substrate; and
a transmitter formed on the lower surface of the substrate and separated with the receiver.

16. The capacitive coupler packaging structure as claimed in claim 15, wherein the first electrode layer is an upper electrode layer and the second electrode layer is a lower electrode layer.

17. The capacitive coupler packaging structure as claimed in claim 15, wherein the first electrode layer is a lower electrode layer and the second electrode layer is an upper electrode layer.

18. The capacitive coupler packaging structure as claimed in claim 15, wherein the at least one capacitor has a horizontal length substantially equal to that of the substrate.

19. The capacitive coupler packaging structure as claimed in claim 15, wherein the outer side of the receiver and the outer side of the transmitter has a distance greater than about 9 mm.

20. The capacitive coupler packaging structure as claimed in claim 15, wherein the substrate is an insulating substrate.

* * * * *